United States Patent [19]
James et al.

[11] Patent Number: 6,084,406
[45] Date of Patent: *Jul. 4, 2000

[54] HALF-CYCLE SATURABLE-CORE MAGNETOMETER CIRCUIT

[75] Inventors: John J. James, Los Gatos; George Hsu, Los Altos, both of Calif.

[73] Assignee: Precision Navigation, Inc., Santa Rosa, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/831,322

[22] Filed: Apr. 1, 1997

[51] Int. Cl.[7] .......................... G01R 33/02; G01R 33/04; G01C 17/28
[52] U.S. Cl. ......................... 324/253; 33/361; 324/247; 324/258
[58] Field of Search ................. 324/207.16, 244, 324/247, 249, 253, 254, 255, 258, 260; 33/361, 363 R; 340/870.33

[56] References Cited

U.S. PATENT DOCUMENTS

| | | |
|---|---|---|
| 4,403,515 | 9/1983 | Iwasaki .......................... 324/207.16 X |
| 4,851,775 | 7/1989 | Kim et al. ............................... 324/247 |
| 5,239,264 | 8/1993 | Hawks ..................................... 324/253 |
| 5,334,935 | 8/1994 | Cook ....................................... 324/253 |
| 5,351,004 | 9/1994 | Daniels et al. ....................... 324/253 X |
| 5,642,046 | 6/1997 | Hawks ..................................... 324/253 |
| 5,694,952 | 12/1997 | Lidman et al. ..................... 324/260 X |
| 5,757,184 | 5/1998 | Kurihara . |

*Primary Examiner*—Gerard Strecker
*Attorney, Agent, or Firm*—Donald R. Boys; Central Coast Patent Agency

[57] ABSTRACT

A magnetic field sensor element comprises an elongated core of high-magnetic permeability material having a coil of electrically-conductive wire wound around and along a central axis of the core. The sensor, due to inductance of the core which changes with application of a local magnetic field, exhibits a characteristic of delaying an electrical input as a function of the strength of a magnetic field in the direction of the axis of the core, and the delay is measured as a function of the strength of the magnetic field. Appropriate circuitry provides at least one step-function voltage input to the coil such that the resulting delay in current charge-up into the coil creates a voltage across the coil which decays to a known reference value. The time delay for the voltage decaying to the reference value varies as a monotonic function with the strength of the applied magnetic field to be measured.

9 Claims, 9 Drawing Sheets

HALF-CYCLE SATURABLE-CORE MAGNETOMETER CIRCUIT

FIELD OF THE INVENTION

The present invention is in the area of apparatus and methods for measuring and quantifying magnetic fields, and pertains in preferred embodiments to a weak-field magnetometer useful for navigation instruments such as digitized compasses and the like.

BACKGROUND OF THE INVENTION

A variety of magnetometers for weak field detection are known in the art. One such is taught in U.S. Pat. No. 4,851,775 by Kim et al. The Kim magnetometer is an oscillator whose frequency of oscillation changes as a function of applied magnetic field, and because of this the sampling rate is limited for fast moving magnetic fields. In using the Kim magnetometer, in order to obtain adequate resolution for measuring frequency shifts of an oscillating signal centered around, for example, 50 Khz, one must count up to 300 cycles of the signal waveform against a 5 Mhz gating clock in order to obtain 150 nT field resolutions. This limits the ability to sample field changes to only about a 50 Hz rate. Furthermore, since multiple cycles must be measured, the sensor circuit becomes an inherent low-pass filter. Although this limitation might be desirable for rejecting unwanted high frequency noise components, such as 60 Hz powerline noise, there is no good technique which can be used with this frequency detection scheme to purposely measure higher frequency events.

The frequency approach in magnetometer technology is also inherently noisy, as a slow comparator is required in order to reject spurious noise from sources such as a microprocessor clock on a power supply in a digitized system. Since a slow comparator moves slowly through the transition range, it is susceptible to frequency modulation (FM) caused by what is known in the art as the Barkhausen effect. This in turn creates noise. This FM limits the bottom of the noise floor to about 15 nT. Power consumption also is relatively high for frequency-based magnetometer systems since such systems must operate on both halves of each oscillator cycle. Typically, in instruments employing this technique, each positive-going cycle must charge up to the positive hysteresis point of a Schmitt trigger as set by a feedback resistor, while each negative cycle must charge down to the negative hysteresis point as well. When the area under the curve is integrated, it can be seen that more power is expended than if only one half of a cycle were used.

What is clearly needed is an apparatus and method for measuring weak magnetic fields, such as the magnetic field of the Earth, which is accurate, relatively inexpensive to manufacture, less noisy than conventional apparatus and techniques, and not inherently bandwidth limited.

SUMMARY OF THE INVENTION

It is an object of the present invention to provide a low cost, temperature-stable, very low-power magnetometer with high sensitivity, very low noise and a sampling rate which allows sampling of low or high intensity magnetic fields from DC to several megahertz. It will be apparent to one skilled in the art of magnetometry that such an invention could be applied to a broad variety of uses where making highly accurate low noise weak field measurements is necessary. The invention is especially effective where relatively high sampling rates are required.

It is another object of the invention to provide such a high speed weak field magnetometer in which the field strength as measured along the sensitive axis is determined by the propagation delay time differences of an input signal current through the inductive sensor element. In a preferred embodiment a sensor for quantifying magnetic field strength is provided, comprising a core of elongated high-magnetic-permeability material having a central long axis; and a multi-turn winding of electrically conducting wire wound on the core along the long axis of the core, and electrically insulated from the core. The sensor in one embodiment further comprises an electrically-insulating, elongated bobbin element having a hollow central axis, wherein the multi-turn winding is wound on the outside of the bobbin and the core is positioned along the hollow central axis of the bobbin. Metglas material is one suitable choice for the core material, and the winding may be provided on the core using a single length of lacquered copper wire having a first end at one end of the bobbin and a second end at the opposite end of the bobbin.

In one embodiment the sensor is utilized in a magnetometer comprising a driver circuit having a voltage-controlled output; a sensor comprising a core of elongated high-magnetic-permeability material having a central long axis and a multi-turn winding of electrically conducting wire wound on the core along the long axis of the core, and electrically insulated from the core, the sensor connected by a first end of the winding to the voltage controlled output of the driver circuit; and a measuring circuit connected to a second end of the winding and adapted to measure time for voltage at the second end to reach a pre-selected reference voltage. The driver circuit may have a reset and a comparator may be used to reset the driver when voltage at an output of the sensor reaches a reference voltage, providing thereby an output having a train of pulses having a pulse width proportional to the strength of any magnetic field in the direction of the long axis of the sensor element.

In another aspect of the invention a navigation instrument is provided comprising three sensing units, each sensing unit comprising a sensor for quantifying magnetic field strength, the sensor comprising a core of elongated high-magnetic-permeability material having a central long axis, and a multi-turn winding of electrically conducting wire wound on the core along the long axis of the core, and electrically insulated from the core; three driver circuits each having a voltage-controlled output and connected one each to a first end of the multi-turn winding of one of the sensors; and a measuring circuit connected to a second end of each of the multi-turn windings and adapted to measure time for voltage at the second end of each of the windings to reach a pre-selected reference voltage. In this instrument the central long axes of the cores of the three sensors are arranged mutually orthogonally. In other embodiments there may be two sensor units at right angles for those situations where measurements in two dimensions will suffice.

In a preferred embodiment the navigation instrument described above further comprises processing and display circuitry coupled to the measuring circuitry, and adapted for processing measurement data reported by the measuring circuitry and displaying processed data to a user. The navigational instrument can be a digital compass, wherein the processed data displayed indicates direction.

In another aspect of the invention a digital compass is provided comprising multiple sensing units, each sensing unit comprising a sensor for quantifying magnetic field strength, the sensor comprising a core of elongated high-magnetic-permeability material having a central long axis, and a multi-turn winding of electrically conducting wire wound on the core along the long axis of the core, and electrically insulated from the core; multiple driver circuits each having a voltage-controlled output and connected one each to a first end of the multi-turn winding of one of the sensors; and a measuring circuit connected to a second end of each of the multi-turn windings and adapted to measure time for voltage at the second end of each of the windings to reach a pre-selected reference voltage. In this digital compass the central long axes of the cores of the three sensors are arranged in different directions. In other embodiments there may be sensors on two axes rather than three.

In other aspects methods for practicing the present invention are provided.

BRIEF DESCRIPTION OF THE DRAWING FIGURES

DESCRIPTION OF THE PREFERRED EMBODIMENTS

The present invention in its several aspects is based on a novel high-sensitivity, weak-field magnetometer device using an inductive sensor element whose reactance is effected by an applied magnetic field and causes a variable output delay to any given input driving signal. In a preferred embodiment this feature enables a methodology wherein timed input pulses cause output pulses whose width, and not frequency or duty cycle, varies monotonically in proportion to any given magnetic field applied externally along the sensitive axis of the sensor element. Such pulses, whose width varies, can be easily measured in many different ways known to those skilled in the art, such as by pulse width detection or integration by a simple capacitive integrator. The measurement of output pulse width, properly calibrated, may be converted to a direct current analog voltage level which can be subsequently converted into a digital input for use by a processing circuit.

A field measuring device as described above can be used in a broad variety of applications, such as Earth field sensing for the purpose of providing heading information for a digital compass or for the purpose of linear or angular position or rate sensing either by proximity or encoder sensing as well as many other traditionally difficult and costly uses for measuring weak DC magnetic fields.

Figure 1:
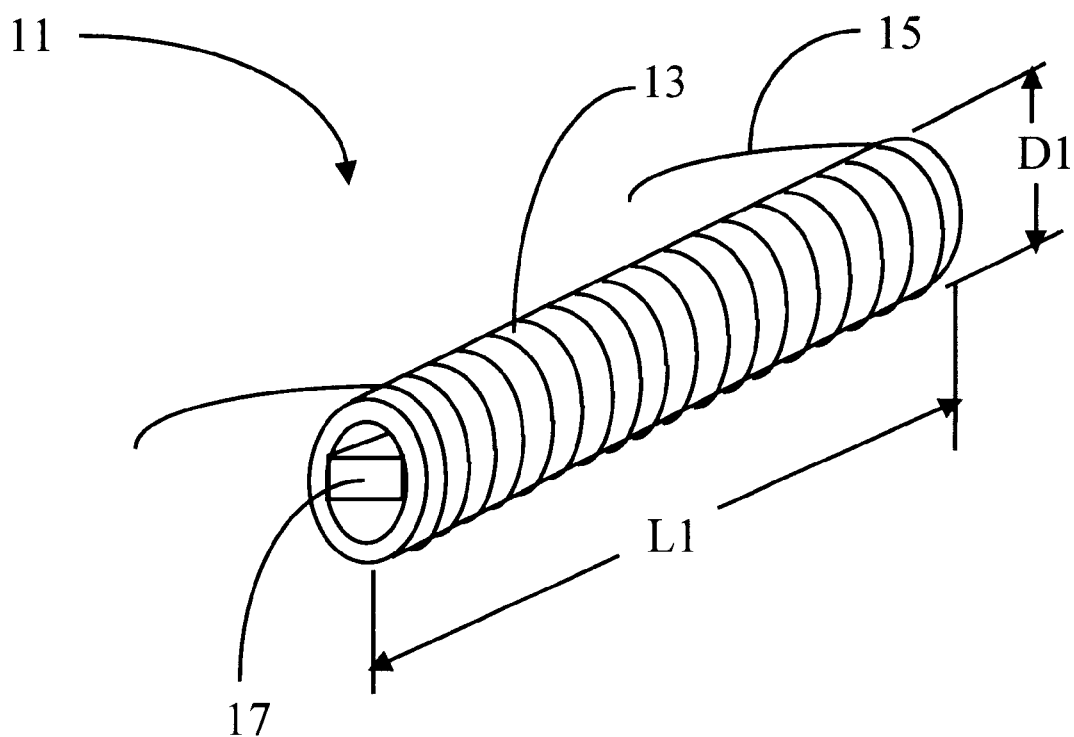
FIG. 1 is an isometric view of an inductive sensor element according to an embodiment of the present invention.

FIG. 1 is an isometric view of an inductive sensor element 11 according to an embodiment of the present invention, useful in circuitry for measuring magnetic fields. Sensor element 11 comprises a plastic bobbin 13 of length L1 and diameter D1 having a winding of N1 turns of electrically conductive wire 15. An elongated core 17 of high-direct-current-permeability material is arranged along the central axis of bobbin 13. In preferred embodiments of the present invention voltage across the coil is monitored by connection to the ends of coil wire 15, and variations in voltage are processed as an indication of the strength of any magnetic field in the direction of the axis of bobbin 13.

In a preferred embodiment, diameter D1 is about 0.15 inches and L1 is about 0.8 inches. High-permeability core 17 in this embodiment is a strip of No. 2705M Metglas made by Allied Signal Corporation fashioned to dimensions of about 0.60 inches in length by about 0.35 inches width by about 0.001 inches thickness. The wire in this embodiment is 41 gauge lacquer-insulated copper magnet wire, wrapped to 1400 turns on the plastic bobbin. It will be apparent to those with skill in the art that these dimensions and materials are convenient and not necessarily limiting to the invention. There are many other materials and geometries that may be used within the spirit and scope of the invention.

Figure 2:
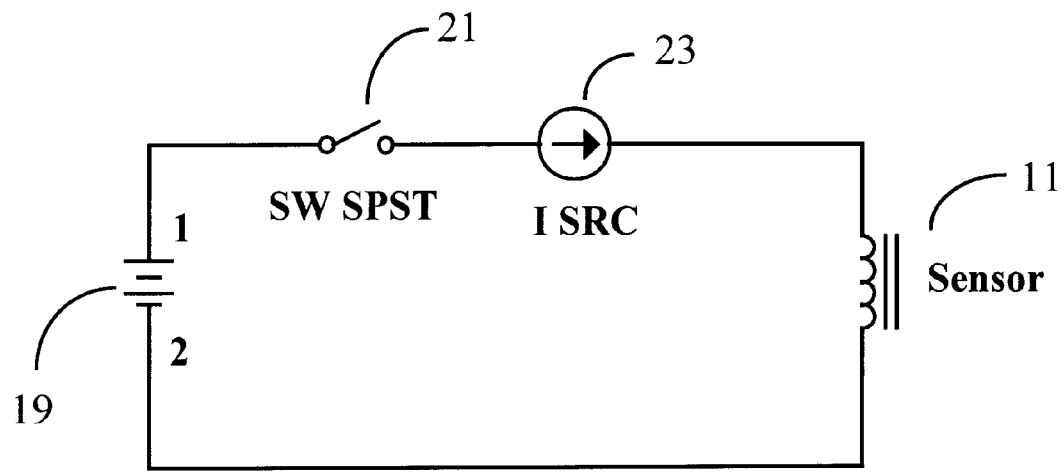
FIG. 2 is a simplified electrical diagram illustrating use of the sensor element of FIG. 1 with other elements to measure magnetic field strength.

FIG. 2 is a simplified electrical diagram illustrating a use of the sensing coil with other elements to measure magnetic field strength. In FIG. 2 a voltage source 19, a switch 21, a current source 23, and sensor 11 are wired in series and in a loop. That is, one side of the sensor element is connected to one side of the voltage source, and the other side of the sensor element is wired in series through the current source and the switch back to the opposite side of the voltage source.

In the circuit of FIG. 2, closing switch 21 supplies a step function to sensor 11. At the instant of closing switch 21, the circuit, because of the reactance of sensor 11, appears to be an open circuit, and essentially the full voltage of the voltage source appears across sensor element 11. As time passes, the apparent resistance of the sensor element diminishes, until, at steady state, the sensor appears as a short circuit, displaying very small voltage drop across the sensor, due to the inherent, steady state resistance of the winding wire over the length of the wire forming the winding on the bobbin. The nature of the sensor element is such that the time constant for voltage decay across the sensor element is a function of the strength of any magnetic field along the length of the sensor element.

In an alternative implementation a resistor may be placed in series with the sensor element, and the voltage across the resistor is measured instead of the voltage across the sensor element. In this alternative, the voltage variation is from zero at the instant the switch is closed, and the voltage rises until the full voltage appears across the resistor at the time that the voltage drop across the sensor element reaches zero. The time constant for voltage increase across the resistor in this alternative is a monotonic function of the strength of any magnetic field along the long axis of the sensor element.

It will be apparent to those with skill in the art that a sudden step function is only one way a signal can be provided to the circuit of FIG. 2. In the case of a step function, the step is repeated periodically, so the input is substantially a square waveform, but essentially any other sort of waveform may be used.

Figure 3:
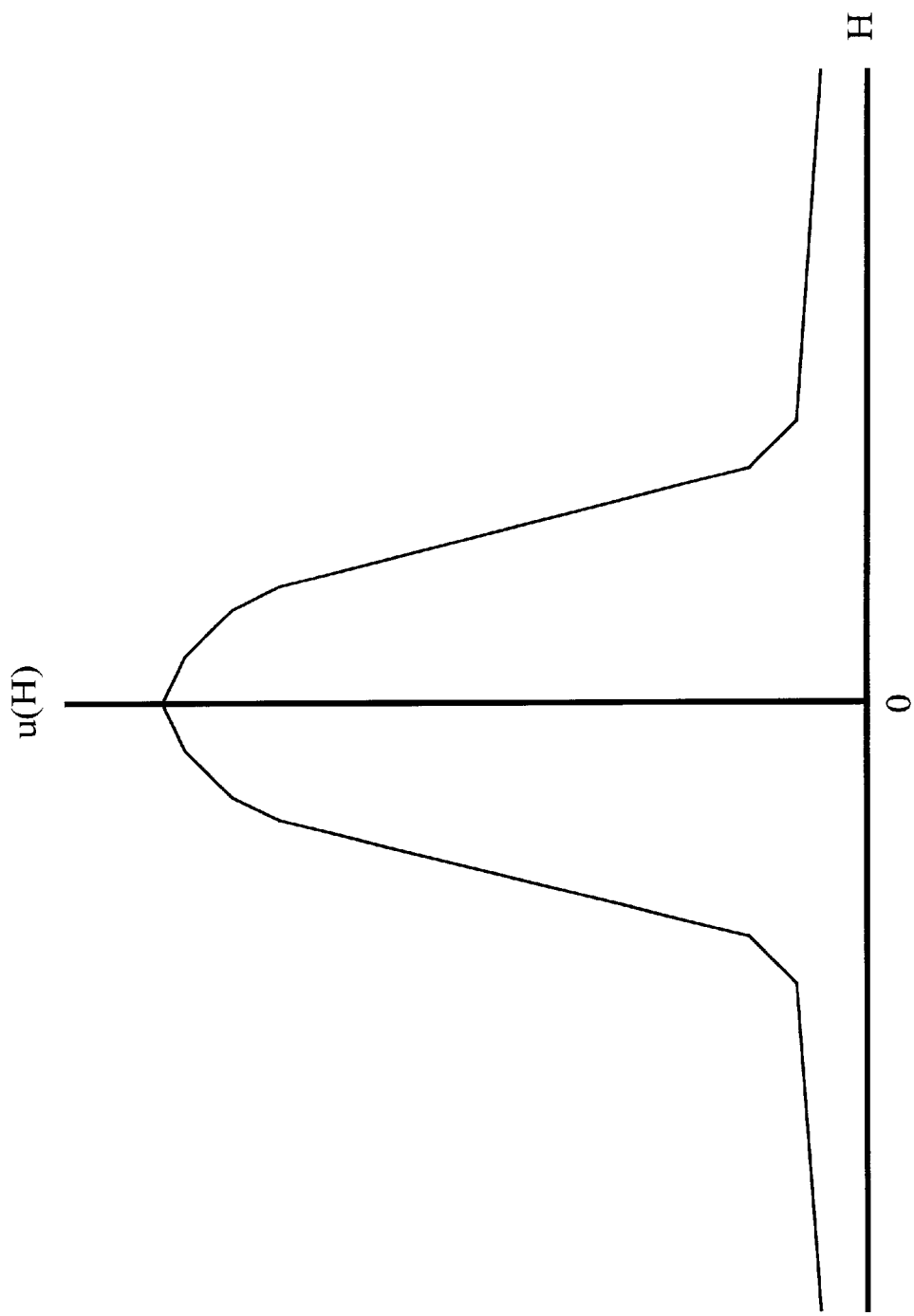
FIG. 3 is a permeability curve representative of the permeability of a core material useful for sensors according to embodiments of the present invention.

FIG. 3 is a typical permeability curve for a high-permeability material such as the Metglas material used in embodiment of the invention herein described. Because the permeability of the Metglas core material is a monotonic function of an applied magnetic field H, the inductance of the sensor is directly proportional to the externally applied magnetic field.

Figure 4:
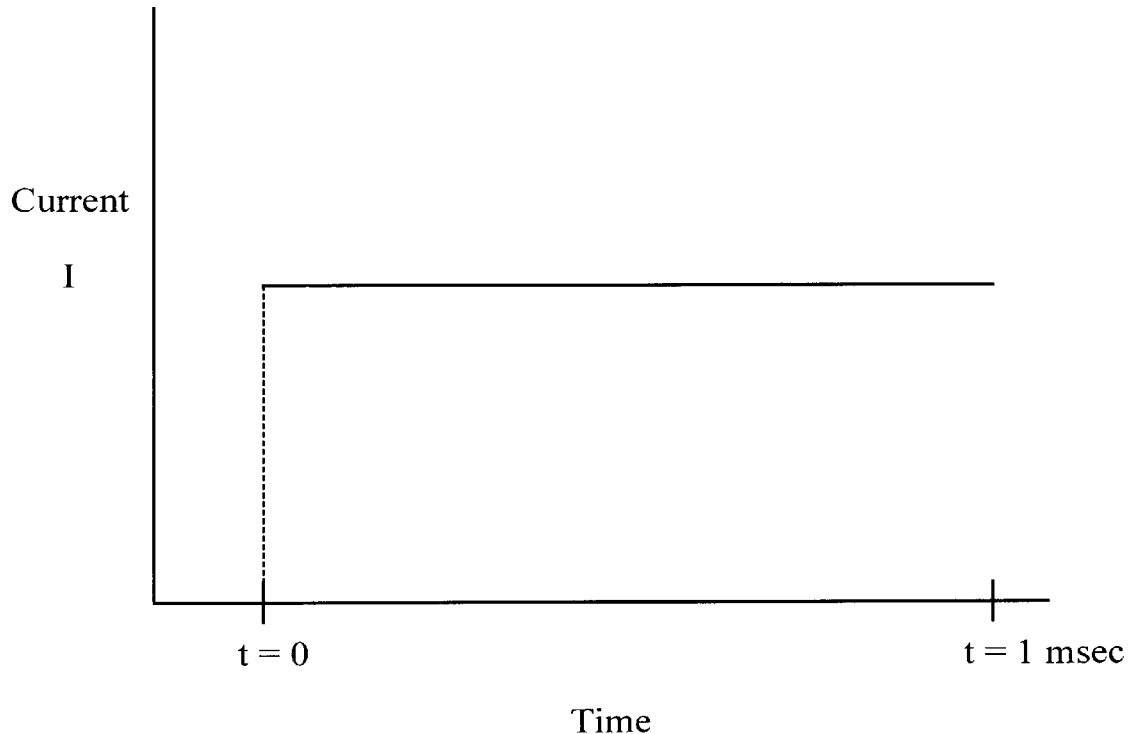
FIG. 4 is a graph illustrating a voltage step function used to drive a sensor in an embodiment of the present invention.

FIG. 4 is a simple graph illustrating instantaneous current in the circuit of FIG. 2 as a result of closing switch 21. When the step function current (FIG. 3) is applied to the sensor coil a voltage develops across the coil whose $e^{-kt}$ decay is proportional to the externally applied magnetic field. The general form of the voltage decay curve is illustrated as FIG. 5. The time (tau) required for voltage across the sensor coil to decay from the initially applied voltage ($V_0$) to an arbitrary reference voltage ($V_{ref}$) is determined by the time constant as determined by the sensor coil's inductance. This inductance is primarily dominated by the inductance of the sensor's high permeability core.

Figure 5:
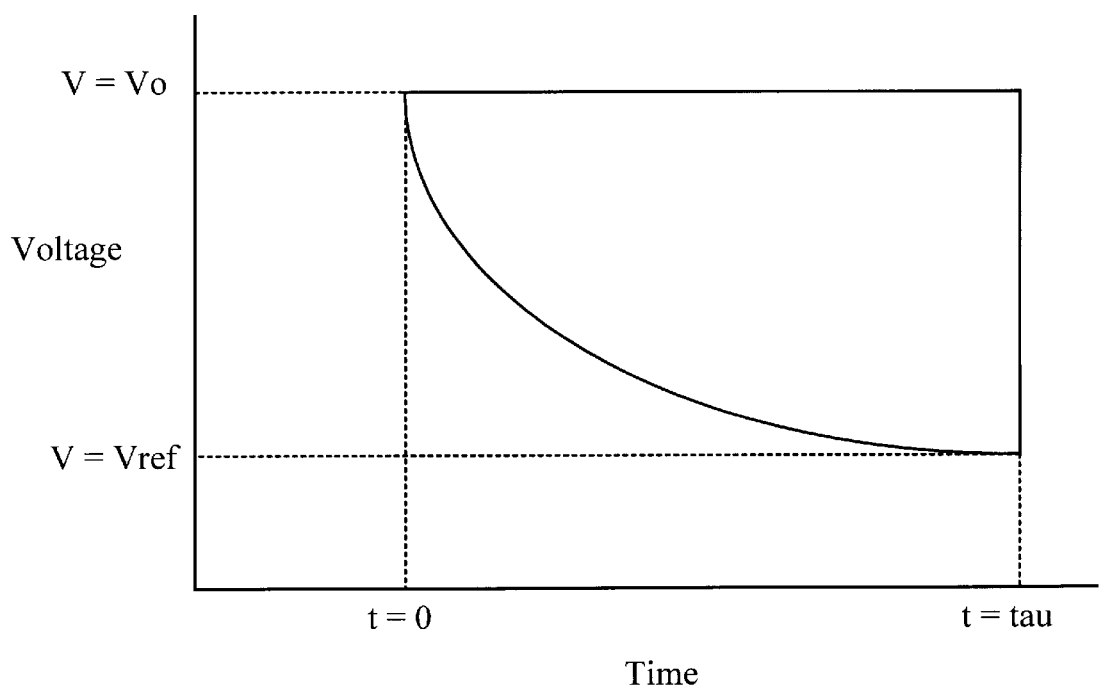
FIG. 5 is a graph illustrating a voltage decay function for a sensor according to an embodiment of the present invention.

The time tau shown in FIG. 5 will differ with different values of time constant according to different values of magnetic field strength H along the axis of the sensor coil. The difference in time interval for this measurable voltage change is temperature stable, and varies proportionally to the applied magnetic field.

The voltage across the sensor coil in the circuit of FIG. 2 may be expressed mathematically as follows:
Equation 1

$$v(t) = L\frac{di}{dt} + Ri$$

Solving Equation 1 for i in the particular instance of a step function such as provided by closing switch 21 in FIG. 1 yields the following solution for i:
Equation 3

$$i = \frac{1}{R}\left(1 - e^{-\frac{Rt}{L}}\right) + Ce^{-\frac{Rt}{L}}$$

It may be seen that the time constant for current into the sensor is simply equal to $$\frac{L}{R}$$

for small changes in field, $$L = \mu_0 n^2 V\left(\frac{dB}{dH}\right)$$

where $\mu_0$ is the permeability of free space, n is the number of turns of the sensor, V is the volume of the core material, and $$\left(\frac{dB}{bH}\right)$$

is the slope of the B versus H curve at any particular point. Substituting $$\mu(H) = \frac{dB}{dH}$$

then $L = \mu_0 n^2 V \mu(H)$

Referring to the $\mu(H)$ versus H curve of FIG. 3, along the linear portions of the right or left half of the curve $\mu(H) = kH$. In other words, $\mu(H)$ is a linear function of H and k is the slope of that part of the curve.

So, along these linear portions of the curve of FIG. 3 the time constant is $$\frac{\mu_0 n^2 V k H}{R}$$

As can be seen from the mathematical derivation then, the time constant of the inductive sensor element is a linear function of H, which is the externally applied magnetic field to be measured. So as stated previously, the time it takes to reach any given reference voltage across the sensor or resistor is a linear function of the applied magnetic field we are trying to measure and is temperature stable.

Figure 6:
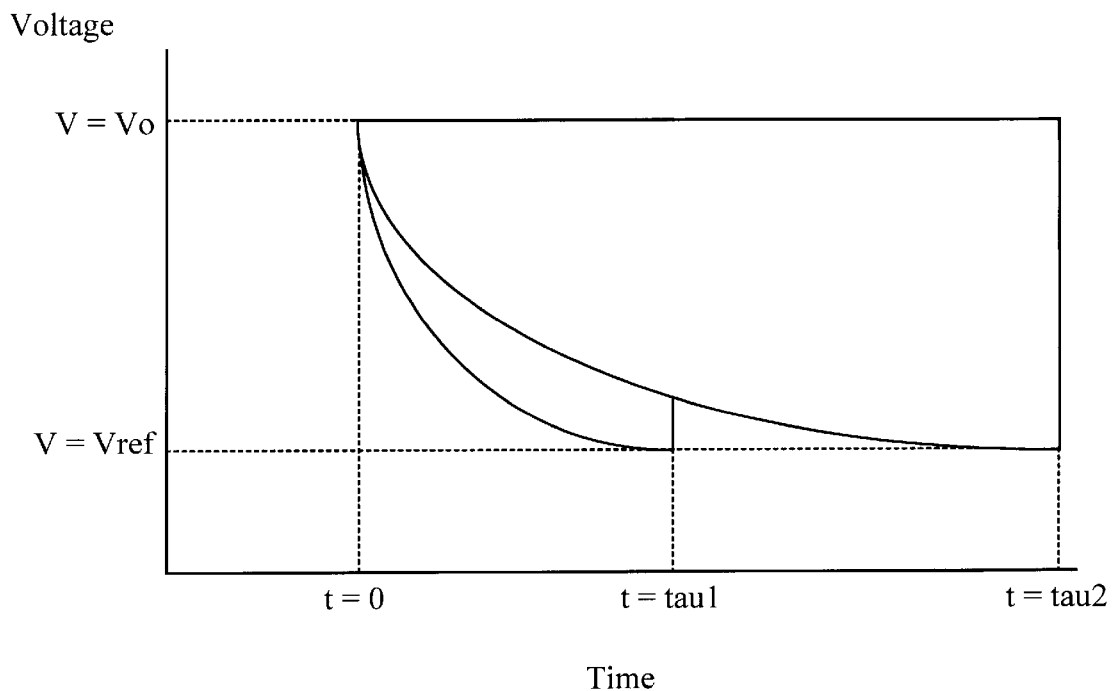
FIG. 6 is a graph similar to the graph of FIG. 5, but showing voltage decay to a reference voltage for a single sensor effected by two different strength magnetic fields.

FIG. 6 is a graph similar to that of FIG. 5, but exhibiting voltage decay across a sensor element under conditions of two different applied fields of strength H1 and H2. Under the influence of the field of strength H1 the time to reach the reference voltage is tau1, and under the influence of the field of strength H2 the time to reach the reference voltage is tau2.

Figure 7:
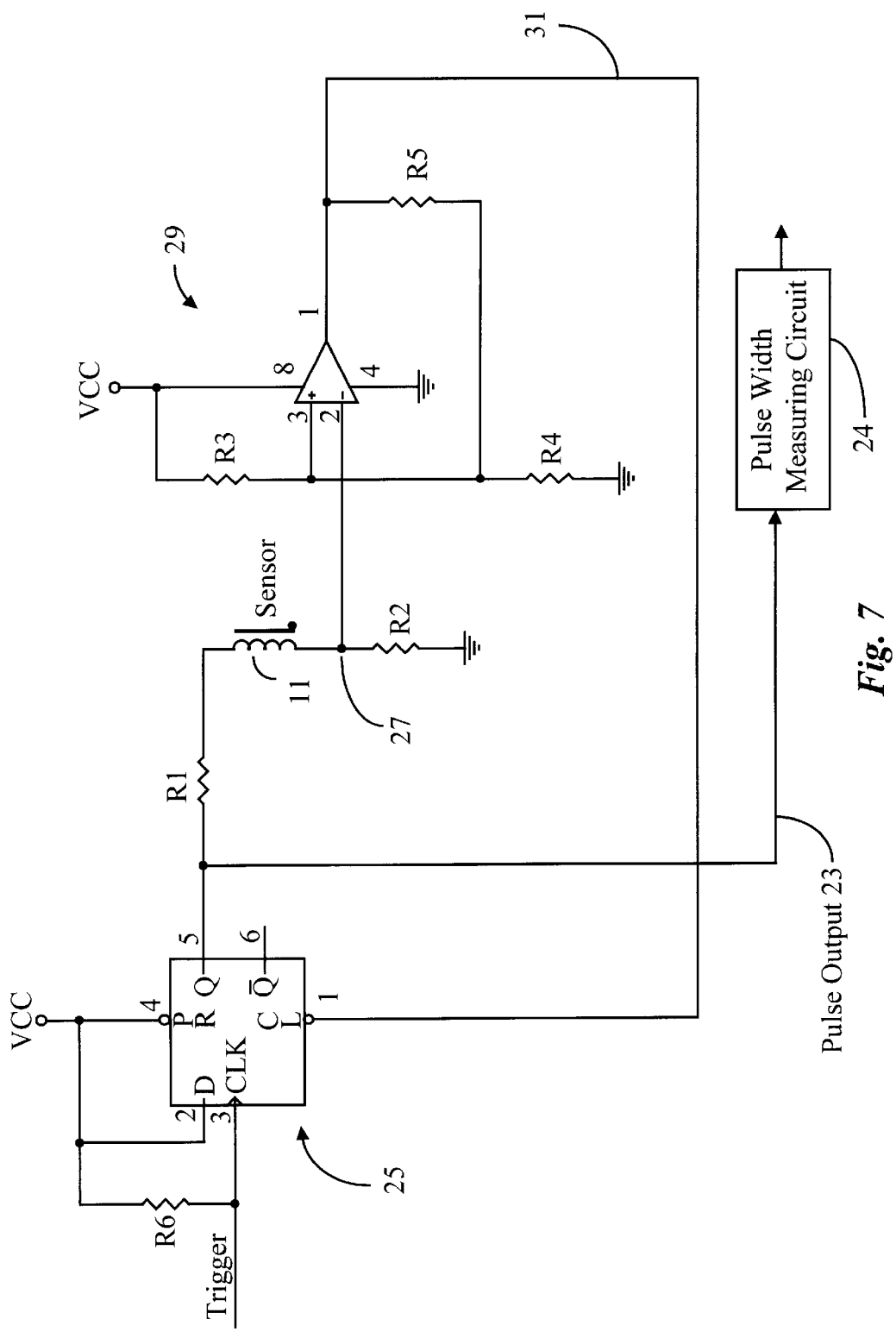
FIG. 7 is an electrical diagram of a circuit for driving a sensor according to a preferred embodiment of the present invention.

FIG. 7 is a generalized electrical diagram of an embodiment of the present invention wherein a triggered flip-flop circuit 25 drives a sensor 11 with a repeating square wave of magnitude $V_{cc}$. When a rising edge of an input trigger is input into the D flip-flop, Vcc is output to Q (pin 5). As the voltage initially appearing across sensor 11 decays, the voltage at point 27 on the far side of sensor element 11 from Q will rise from ground potential toward $V_{cc}$ as a result of resistor R2.

A comparator 29 having a preset trip point value is provided connected by pin 2 to point 27. Once the voltage at point 27 (at pin 2 of the comparator) reaches the pre-set trip point value, the comparator will fire low, which, by virtue of line 31 will clear the D flip-flop and cause the output Q to go low.

In the circuit of FIG. 7, the period of the input trigger function is deliberately selected to be longer than any expected time for voltage at pin 2 of the comparator to reach the reference voltage for the highest value of field strength H expected to be measured. Because the comparator fires each time the voltage at pin 2 reaches a pre-set trip value, resetting the flip-flop, and because this time will be less than the period of the input trigger function, the output at Q will be a square wave of magnitude Vcc wherein the pulse width is determined by the strength of any magnetic field along the axis of sensor element 11. This output pulse train appears on line 23, and may be connected to suitable circuitry for measuring the pulse width as a function of the magnetic field strength.

An advantage of this particular circuit is that it can be gated once for one output pulse, or as many times as is necessary for adequate resolution to be obtained. If the circuit is gated with a clock signal, it will output a train of pulses where each pulse width is determined by the strength of an externally applied magnetic field. It can, of course, be gated with a clock whose frequency is as fast or as slow as desired thereby obtaining high sampling rates with a fast clock, or for saving power and obtaining high resolution with fewer pulses with a slow gating clock.

FIGS. 8A through 8D illustrate several output pulse trains produced as a result of input trains of two different gating clock frequencies and for two different values of magnetic field to be measured.

Figure 8A:
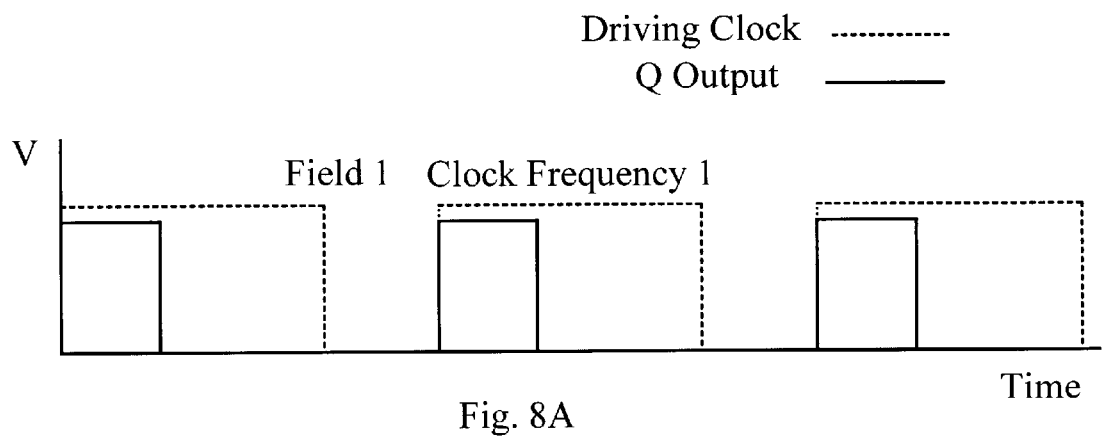
FIGS. 8A–8D are square-wave diagrams illustrating pulse width produced for two different fields under conditions of two different input frequencies for the circuit of FIG. 7.
Figure 8B:
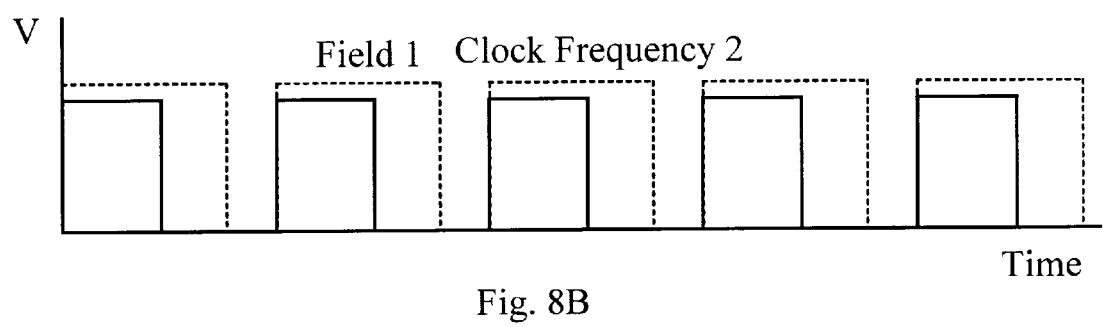
Figure 8C:
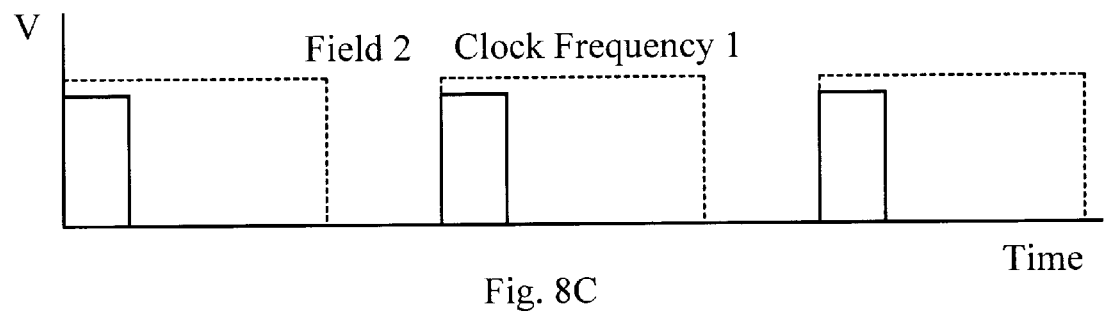
Figure 8D:
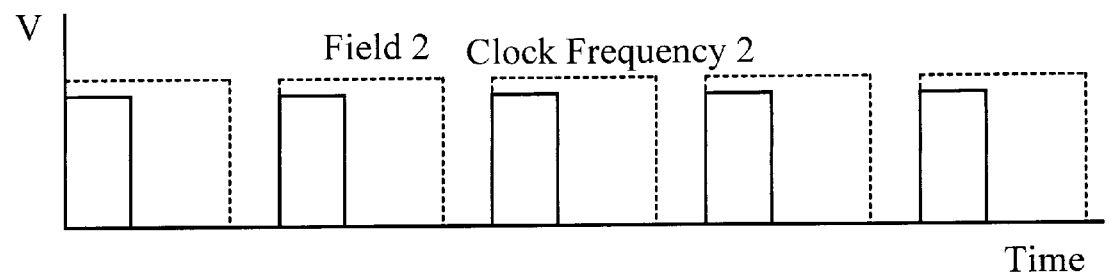

The external magnetic field strength H1 is common for FIG. 8A and FIG. 8B, but the driving signal clock frequency 1 for FIG. 8A is slower than clock frequency 2 for FIG. 8B. The result is that the output pulse is of constant width, independent of clock frequency. FIG. 8C and FIG. 8D repeat this illustration for a different magnetic field strength but the same clock frequencies used for FIGS. 8A and 8B. It is only necessary that the input pulse width be longer than the output pulse width, which is a simple matter to preset by calculation, and to adjust empirically if necessary.

There are many uses in the art for the magnetic field strength measuring apparatus according to embodiments of the present invention. The output pulse train on line 23 of FIG. 7, for example, can be fed into a simple voltage integrator to produce a fast-moving DC voltage signal which will be proportional to the applied magnetic field, providing highly accurate, low-noise magnetic field measurements. Alternatively, the pulse width can be measured directly with any variety of counting and timing schemes for use by a microprocessor without necessitating any analog to digital conversion.

For high speed magnetic encoder applications, the gated clocking is especially useful, since a trip level on the pulse width can be set and a reference one-shot can be generated by the clock signal and fed into an AND gate for high speed determination as to whether a variable field being measured has reached a certain threshold value. When a preset magnetic field strength threshold has been reached, the AND gate will output a stream of pulses for as long as the magnetic field strength stays above the threshold level. Conversely the AND gate will output nothing when the magnetic field is below the threshold. Circuits to accomplish the purposes described herein using the output pulse train from the apparatus with a unique sensor according to an embodiment of this invention may be provided by skilled persons from known circuitry of the sort, without undue experimentation, and are therefore not presented here in detail.

By strategically selecting a comparator trip point and a clocking frequency for different purposes, a variety of speed, sensitivity, resolution, and power savings can be achieved with any given sensor coil and core geometry. As an example, power consumption using a sensor according to an embodiment of the present invention with circuitry described herein and made by Precision Navigation, Inc. has been measured to be as low as 90 microamps at 3 volts, by using a slow 30 Hz driving signal. The Earth's magnetic field was still measured effectively at full resolution in this low-power operating mode.

A very advantageous feature of the new technology taught herein is that the sensor geometry can be provided to complement specific circuit parameters, thereby customizing a magnetometer for optimal performance for any particular magnetic sensing application. Another advantage is that the noise floor is extremely low. This is because the magnetometer always operates in one or the other of either a chargeup or in a decay mode, and is not a mix of the two. This, in effect, minimizes the contribution of noise from the well-known Barkhausen effect as the transition of the core material through the permeability curve is always in one direction and is always done in a consistent manner during any one period of the signal and clocking pulse.

The technique taught herein also minimizes noise caused by any residual hysteresis which the high permeability material might exhibit, thereby eliminating any ambiguity which is caused by the effect of retentivity which manifests itself in the B versus H curve of the core material, causing the classical looping curve path during the demagnetization of the material by the method of reversals [pp 242, Fundamentals of Electricity and Magnetism, Loeb, by John Wiley and Sons, 3rd Edition]. Additionally, a fast comparator can be used without injecting noise, since the sole function of the comparator is that of a voltage level detector. This allows quick transition and substantially reduced FM noise from any ambiguity caused by the hysteresis voltage levels of a Schmitt trigger.

Another source of noise and non-linear response in the prior art is that the permeability of Metglas is also a function of frequency. Since some prior art devices change frequency for different applied magnetic field strength, the permeability of a sensor is changing as a direct result of the frequency shift alone. The invention described here has the advantage of always operating at a fixed frequency dependent upon the clocking signal, which in practical application will always remain fixed As a result of the improvements described, the noise floor of the system in an embodiment of the present invention has been measured at well below 1 nano Tesla, and may with further development possibly be in the 1 pico Tesla range. The sensitivity of the device has been observed to match that of laboratory-grade reference magnetometers, but implemented with less than one dollar's worth of components.

It is the material property of the high permeability Metglas material or any equivalent substance which is key to enabling this invention to work as described. Without the high permeabilities of the Metglas materials, the change in pulse widths would not be present or measurable, as the weak Earth field and other fields like it would not be able to cause any Barkhausen alignment of the magnetic domains of those other core substances such as iron. Additionally, low-hysteresis exhibited by the Metglas materials also allows the invention to operate within the linear regions of the permeability curve and does not necessitate the operation of the device by driving the core into saturation in order to circumvent the wandering effect caused by retentivity. This is the case with almost all of the magnetometer inventions based on saturable core devices which precede this present invention.

Another aspect of the present approach which should be discussed is that the step function driving signal, which was described earlier, contains a natural DC bias which biases the operating point of the sensor core material to the desired operating region on its permeability curve. This not only provides for optimal operating sensitivity, but it can also be seen that by structuring the electronics to electrically reverse the sensor coil within the circuit, that a forward and a reverse reading can be obtained, which if subtracted from each other will provide a reading value which will be independent of drifts due to temperature, age, or manufacturing defects of the sensors. The inventors use an operating circuit topology which is a cycle by cycle differencing integrator, which puts out a zero drift-corrected DC voltage for input into a volt meter or an analog to digital converter. This differencing integrator actually does the forward and backward biasing and sums up the voltage difference between the two and contributes that value to the integrated DC voltage.

Another extremely advantageous feature in embodiments of the present invention is that there is no perceptible drift in the operation of the sensor due to temperature. The only circuit parameter which changes with temperature in a significant fashion for temperatures less than the Curie point is the series resistance of the copper wire used in the windings. The time constant change due to this circumstance remains constant, because as the resistance in the wire moves up or down, the inductance of the coil also moves up or down in a manner which tracks the resistance change. This keeps the overall time constant at the same value for a given magnetic field. Since the input of the excitation signal is a step function at the rail value for the comparator, the DC bias component to the sensor core is constant over temperature and does not drift, unlike other biasing schemes used in other prior art magnetometer circuits. This creates a temperature-stable magnetometer.

In the preferred embodiment described with reference to FIG. 7, the magnetometer is constructed of the following: 1) a plastic bobbin with diameter of 0.15" and overall length of 0.8"; 2) a Metglas core of Allied Signal Corp. 2705M cut to the dimensions of 0.600"×0.35"×0.001" and placed in the center of the bobbin of item 1 above; 3) 1400 turns of 41 guage lacquer-insulated copper magnet wire available from which is almost layer wound onto the bobbin of item 1 above with the core of item 2 above in the center of the unit.

Electrical connection is made to this sensor coil as shown in FIG. 7. D-Flip Flop 25 in this embodiment is an AC74 available from many manufacturers, such as National Semiconductor Corp. The analog comparator can be any comparator, but the one used for this example is a model TLC3702 from Texas Instruments. Vcc can be almost any voltage, though a nominal voltage of 3 volts has been used preferentially in experiments connected with the present invention. Pulldown resistor $R_6$ in input to the D Flip-Flop is nominally 100 Kohms, although the specific value will not seriously effect the operation of the device. The series resistors R1 and R2 to the sensor coil are chosen to bias the sensor to the desired area of operation on the permeability curve and in this example are 330 ohms each. The comparator reference voltage biasing resistors R3, R4, and R5 are 68 Kohm (R3), 10 Kohm (R4) and 22 Kohm (R5).

Figure 9:
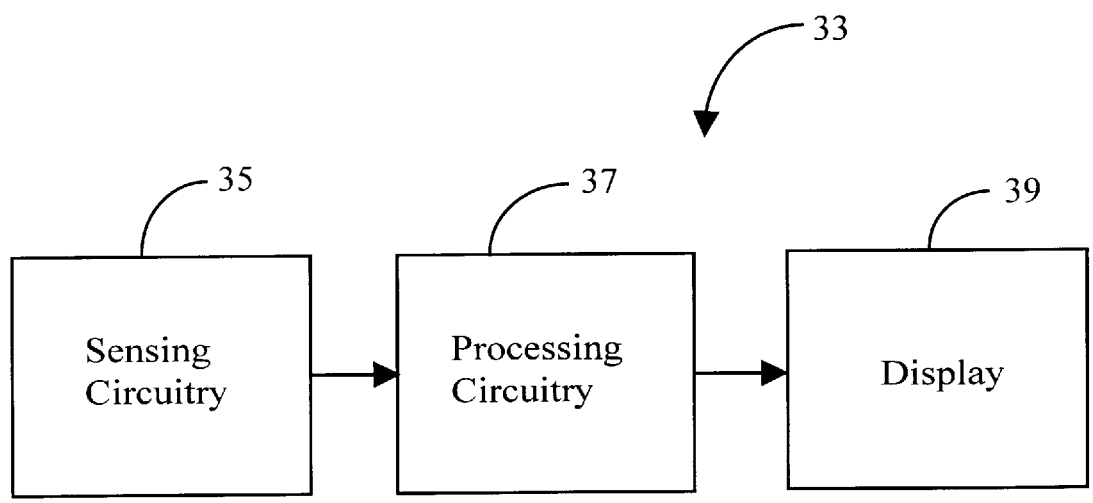
FIG. 9 is a block diagram illustrating elements in an instrument utilizing a sensing circuit according to an embodiment of the present invention.

FIG. 9 is a block diagram illustrating elements in an instrument utilizing a sensing circuit 33 according to an embodiment of the present invention. Sensing circuit 33 may be of the architecture of that circuit shown in FIG. 7, or some elements for driving and measuring the sensor element may be different but drawn from circuitry known in the art. In the instrument of FIG. 9 delayed output of input to sensing circuitry 35 is received by processing circuitry 37, processed to yield field information, and the field information is further processed to be displayed on a display 39. Instruments of this sort utilizing single sensing elements may be used for applications wherein field direction is known and field strength measurement is needed.

Figure 10:
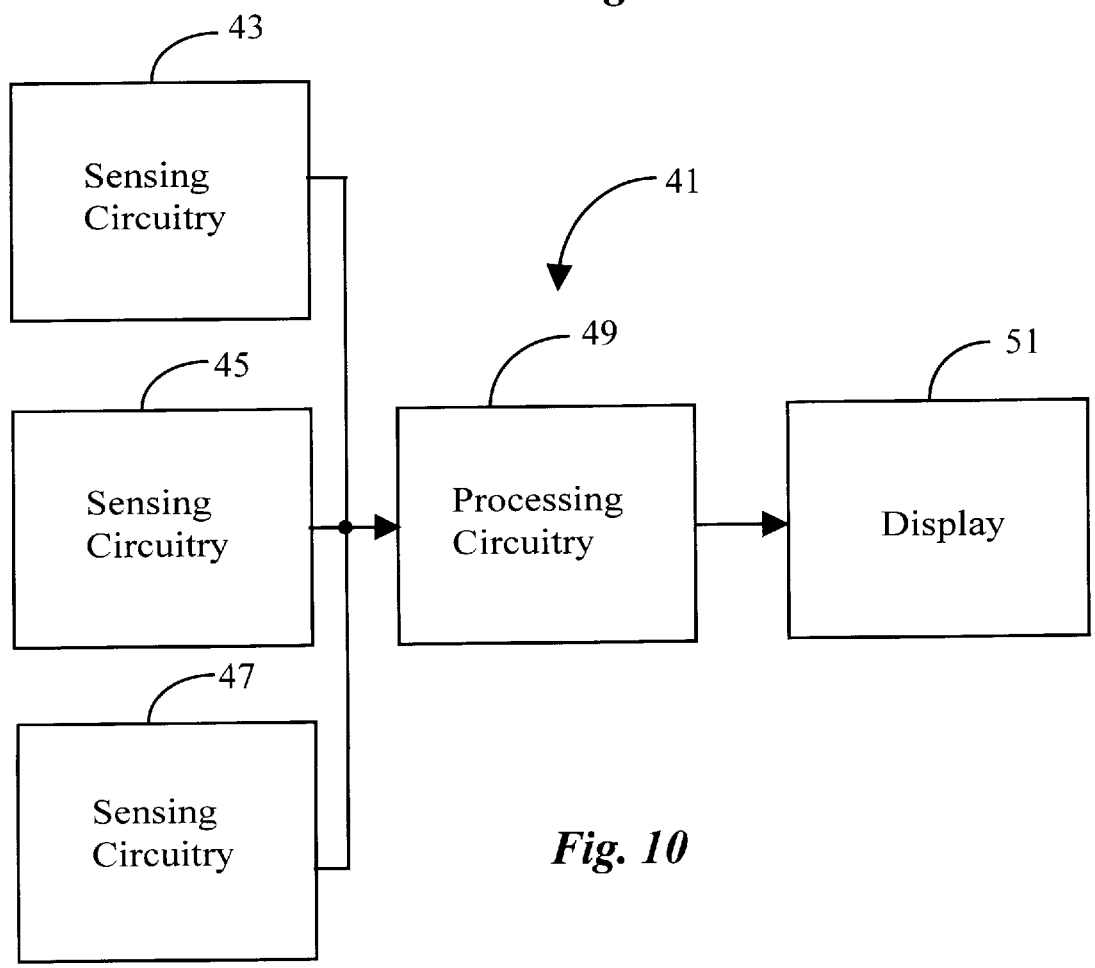
FIG. 10 is a block diagram illustrating an instrument utilizing sensing circuitry according to an embodiment of the present invention, wherein multiple sensors are arranged to provide data relative to field direction as well as field strength.

FIG. 10 is a block diagram of an instrument 41 utilizing sensing circuitry 43, 45, and 47 according to an embodiment of the present invention, wherein multiple sensors are arranged with axes in different directions to provide data relative to field direction as well as field strength. In one embodiment sensors may be arranged mutually orthogonally (X, Y, Z) and suitable algorithms employed by processing circuitry 49 providing display data to a display apparatus 51. This architecture may be utilized for a digital compass, for example.

It will be apparent to those skilled in the art that many alterations in form and details of the embodiments of the invention described herein may be made without departing from the spirit and scope of the invention, and in various embodiments inventive elements from the teaching herein may be adapted to instruments and functions of many sorts. Many such alterations have already been described above. There are many others. For example, there are other materials than the specific Metglas used in the embodiments described which may be useful in other embodiments. There is a broad range of sizes of sensor element components which may be used as well. There are similarly many applications to which embodiments of the invention may be put, such as navigational equipment (mentioned previously). For example, since the sensor is sensitive to the component of any applied field which lies along the long axis of the sensor, two different sensors at different angles can determine field direction in a plane, and three different sensors physically arranged mutually at known angles (right angles for Cartesian analysis) to one another and connected to suitable circuitry may measure both the strength and three-dimensional direction of an applied magnetic field. The polarity of a field may be similarly determined. It is intended that such changes be included within the spirit and scope of the invention, and the scope of the invention is limited only by the claims below

What is claimed is:

1. An instrument for measuring a magnetic field, comprising:
   a sensor element having a high-permeability core with a long axis and a winding around the core, the sensor element disposed in the magnetic field to be measured;
   a remotely-operable switch having a first side connected to the sensor element and a trigger input for closing the switch;
   a voltage source connected to a second side of the remotely operable switch;
   a sensing circuit for measuring one of voltage or current and connected to the sensor element, the sensing circuit having a switch-control output connected to open the remotely-operable switch;
   a pulse output line connected to the first said of the remotely-operable switch; and
   a pulse-width measuring circuit connected to the pulse output line;
   wherein the trigger input closes the switch, the sensing circuit initiates the switch control output at a predetermined magnitude of voltage or current thereby causing the remotely-operable switch to open, and wherein the pulse width measuring circuit measures the pulse width resulting on the pulse output line as an indication of vector value of the magnetic field.

2. The instrument of claim 1 wherein the remotely-operable switch has a clock input causing the switch to close once per clock cycle.

3. The instrument of claim 1 wherein the remotely-operable switch comprises a commercially available flip-flop device having the characteristics of an AC74 flip-flop.

4. The instrument of claim 1 wherein the sensing circuit comprises a commercially-available comparator having the characteristics of a TLC3702 analog comparator manufactured by Texas Instruments corporation.

5. The instrument of claim 1 comprising two or more inductive sensor elements arranged in a fixed angular displacement, each having separate series connections to switching elements and current limiting elements, and separate sensing circuits, such that one measurement from each sensor element may be used to calculate two or three-dimensional vector values for a measured magnetic field.

6. The instrument of claim 4 comprising three sensor circuits wherein the measurements are used to determine a three-dimensional field vector.

7. A method for measuring a magnetic field with a magnetic field measuring instrument comprising a sensor element having a high-permeability core with a long axis and a winding around the core connected to a first side of a remotely-operable switch having a trigger input for closing the switch, the inductive sensor element disposed in the magnetic field to be measured, a voltage source coupled to the winding of the sensor element through a connection to a second side of the remotely-operable switch, a sensing circuit for measuring one of voltage or current connected to the sensing element, the sensing circuit having a switch control output connected to open the remotely-operable switch, a pulse output line connected to the first side of the remotely-operable switch, and a pulse-width measuring circuit connected to the pulse output line, the method comprising steps of:

(a) closing the remotely-operable switch by the trigger input;

(b) initiating the switch control output by the sensing circuit at a predetermined magnitude of voltage or current to open the remotely operable switch;

(c) measuring a pulse width generated on the pulse output line by the pulse width measuring circuit for an indication of vector value of the magnetic field.

8. The method of claim 7 further comprising a step for causing, by a clock input, a switch closure once per clock cycle.

9. The method of claim 7, wherein, in step (a), two or more inductive sensor elements arranged in a fixed angular displacement, each having separate series connections to switching elements and current limiting elements, and separate sensing circuits, are disposed in the field to be measured, such that one measurement from each sensor element may be used to calculate two or three-dimensional vector values for a measured magnetic field.

* * * * *

UNITED STATES PATENT AND TRADEMARK OFFICE
CERTIFICATE OF CORRECTION

PATENT NO.    : 6,084,406
DATED         : July 4, 2000
INVENTOR(S)   : John J. James and George Hsu It is certified that error appears in the above-identified patent and that said Letters Patent is hereby corrected as shown below:

Column 10,
Line 43, now reads "a pulse output line connected to the first said of the" should read -- a pulse output line connected to the first side of the --

Signed and Sealed this

Eighth Day of January, 2002

Attest:

JAMES E. ROGAN
Attesting Officer    Director of the United States Patent and Trademark Office